United States Patent [19]
Butler

[11] Patent Number: 5,323,121
[45] Date of Patent: Jun. 21, 1994

[54] FOLDED CASCODE OPERATIONAL AMPLIFIER WITH GAIN ENHANCING BASE CURRENT COMPENSATION

[75] Inventor: James R. Butler, San Jose, Calif.

[73] Assignee: Analog Devices, Inc., Norwood, Mass.

[21] Appl. No.: 84,004

[22] Filed: Jun. 29, 1993

[51] Int. Cl.[5] .............................................. H03F 3/45
[52] U.S. Cl. .................................... 330/252; 330/261; 330/311
[58] Field of Search ......................... 330/255, 261, 311

[56] References Cited

U.S. PATENT DOCUMENTS 4,687,984 8/1987 Butler .................................. 323/315
5,140,280 8/1992 Vyne et al. ........................... 330/255

Primary Examiner—James B. Mullins
Attorney, Agent, or Firm—Koppel & Jacobs

[57] ABSTRACT

The gain of a folded cascode operational amplifier is enhanced by connecting the current circuits of added compensation transistors to supply the current circuits of pre-existing gain transistors. Changes in the current through the primary gain transistor resulting from a change in the output load produce approximately equal changes in the base currents of both the primary gain and primary compensation transistors. The change in the compensation transistor's base current is transmitted through the amplifier circuitry to supply the change in the gain transistor's base current, rather than forcing a change in the input voltage differential to supply this current. The differential input signal is thus less sensitive to changes in the output, resulting in higher transconductance and gain. Providing a similar compensation loop for a second gain transistor through the second compensation transistor produces a circuit balance that lowers both the circuit's offset voltage, and the temperature dependence of the offset voltage.

6 Claims, 1 Drawing Sheet

FOLDED CASCODE OPERATIONAL AMPLIFIER WITH GAIN ENHANCING BASE CURRENT COMPENSATION

BACKGROUND OF THE INVENTION

1. Field of the Invention

This invention relates to operational amplifiers (op amps), and more particularly to a gain enhancement that is particularly useful for low voltage, single supply op amps.

2. Description of the Related Art

Amplifiers are being designed to work with lower and lower supply voltages. Whereas in the past positive and negative 15 volt supplies ("rails") were typical, amplifiers are presently being designed to work with +5 volt and ground rails, and even +3 volt and ground rails. A primary reason for the steady reduction in power supply levels is the need for lower power dissipation in battery powered electronic devices, such as laptop computers and cellular telephones.

An improved operational amplifier circuit is described in U.S. Pat. No. 4,687,984 by the present inventor, "JFET Active Load Input Stage", which provides improvements in both common mode rejection ratio (CMRR) and common mode voltage range (CMVR), and also is less likely to go into saturation or cut-off states during high slew rates. The circuit is known as a "folded cascode" operational amplifier, and has been used successfully in numerous applications. However, it has a limited transconductance (defined as the change in output current for a given change in input voltage), which limits the amplifier's gain and thereby makes it less useful for low voltage, single supply applications than it might otherwise be.

SUMMARY OF THE INVENTION

The present invention seeks to provide an improved folded cascode operational amplifier with an enhanced gain, that also achieves both a lower voltage offset and a lower variation in voltage offset with temperature.

These goals are achieved with a base current compensation arrangement for the gain transistor used in the amplifier's gain stage. A current compensation circuit is connected between the collector-emitter circuit and the base of the gain transistor to supply the change in base current associated with changes in the collector-emitter current that result from changes in the amplifier's output current. Supplying the gain transistor's current excursions with the compensation circuit limits any change in the input voltage levels when the output current changes. The amplifier's transconductance and gain are thus increased.

The current compensation circuit preferably includes a compensation transistor that has its collector-emitter circuit connected i series with the collector-emitter circuit for the gain transistor, and its base connected to supply an actuating current for the remainder of the compensation circuit. By matching the compensation transistor with the gain transistor and using the compensation transistor's base current to supply changes in the gain transistor's base current, first order variations in the gain transistor's collector-emitter current as a function of changes in the amplifier's output current can be compensated.

In the preferred embodiment, a second gain transistor is nominally matched with and connected to balance the first gain transistor. A second current compensation circuit is connected between the collector-emitter and base of the second gain transistor to supply its base current in a manner similar to the compensation for the first gain transistor. A balancing of the gain and compensation transistors results in a lower offset voltage and offset voltage temperature coefficient.

These and other features and advantages of the invention will be apparent to those skilled in the art from the following detailed description, taken together with the accompanying drawing.

DETAILED DESCRIPTION OF THE INVENTION

Figure 1:
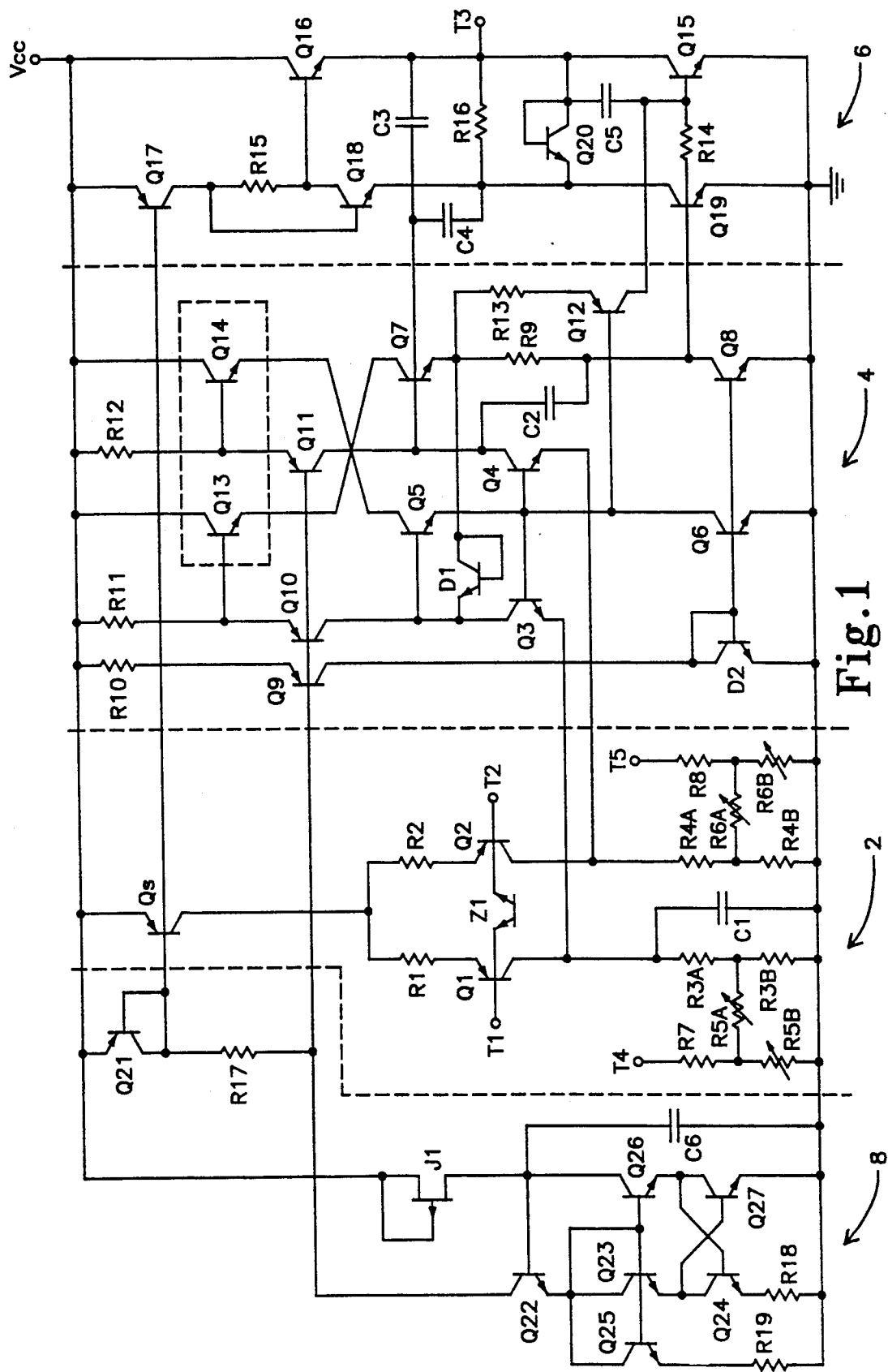
FIG. 1 is a schematic diagram of a folded cascode operational amplifier that incorporates the present invention.

A preferred circuit configuration that embodies the principles of the invention is illustrated in FIG. 1. While a specific circuit is shown, it could be modified in various ways without departing from the invention. For example, the bipolar transistors types could be reversed (npn vs. pnp), with a corresponding adjustment in the voltage supplies. Accordingly, the circuit shown is for illustration only, and is not intended to limit the invention to any particular circuitry.

The operational amplifier shown in the drawing can be conceptually divided into several different stages, as indicated by dashed lines. An input stage 2 receives a differential input voltage signal at input terminals T1 and T2, and provides a corresponding differential signal to a gain stage 4. An output stage 6 receives an amplified signal from the gain stage, and converts it to an output signal at output terminal T3. A bias circuit 8 provides current source bias signals for the remainder of the circuitry.

In the input stage 2, a pair of differentially connected transistors Q1 and Q2, which can be either bipolar or junction field affect transistors (JFETs), have their current circuits connected together on one side to divide the output of a current source transistor Qs, with resistors R1 and R2 in series with Q1 and Q2, respectively. As used herein, a transistor's "current circuit" refers to the collector-emitter circuit of a bipolar transistor, or the source-drain circuit of a FET; a transistor's "control circuit" refers to the base of a bipolar device, or the gate of an FET.

The input terminals TI and T2 are adapted to receive differential input signals. In the manner characteristic of differential amplifiers, Q1 and Q2 divide the current from Qs in mutual opposition, with the amount of current through each transistor varying according to the relative input voltage signals applied to their bases from the input terminals. If a constant, known bias is applied to one of the input transistor bases, the magnitude of the signal at the base of the other input transistor can be determined by the amount of current flowing through that transistor.

The input current source Qs operates from a positive voltage supply bus Vcc, while the collectors of pnp input transistors Q1 and Q2 are connected to a relatively negative voltage supply bus (preferably ground potential) through respective series-connected first and second input resistors R3A, R3B and R4A, R4B. A laser trimming capability for the input resistors is provided by laser trimmable resistors R5A, R5B, which are connected from ground to the junction of R3A with R3B, and by laser trimmable resistors R6A, R6B connected in series between ground and the junction of R4A with R4B. An even more precise trimming capability is offered by fixed resistors R7 and R8, which are connected respectively between the junctions of R5A, R5B and R6A, R6B and terminals T4 and T5; a potentiometer (not shown) can be connected across T4 and T5 for additional trimming. These trimming functions can be used to minimize the circuit's offset voltage (Vos). In addition, a capacitor C1 is connected in parallel with resistors R3A, R3B. This capacitor and the other capacitors included in the circuit are for frequency compensation purposes, to assure unity gain stability.

The gain stage 4 includes first and second active load npn bipolar transistors Q3 and Q4, whose emitters are connected to the collectors of input transistors Q1 and Q2, respectively. The bases of Q3 and Q4 are connected together for common biasing. A bias circuit for these transistors consists of (1) another npn bipolar transistor Q5 that has its emitter connected to the bases of Q3 and Q4, and its base connected to the collector of Q3, and (2) a current source transistor Q6 that draws current from the common base junction of Q3/Q4 to the ground bus. The collector of Q4 is connected to the base of a gain transistor Q7, whose emitter is connected through resistor R9 to the collector of another npn current source transistor Q8, which is preferably matched with Q6. The emitter of Q7 is limited at about a one diode voltage level above the base of Q5 by a diode-connected transistor D1, while a capacitor C2 is provided between the collectors of Q4 and Q8. The current source transistors Q6 and Q8 are connected with their bases in common to mirror the current through another diode-connected transistor D2, which in turn is supplied by a current source pnp transistor Q9 whose emitter is connected to the Vcc line through resistor R10. Active load transistors Q3 and Q4 are supplied with current from the collectors of respective pnp active load current source transistors Q10 and Q11, whose emitters are connected to the Vcc line through resistors R11 and R12, respectively. Outputs from the gain stage 4 are provided to the output stage 6 from the collectors of Q8 and another pnp transistor Q12; the base of Q12 is connected to the emitter of Q5, while its emitter is connected through resistor R13 to the emitter of Q7.

The circuit as described thus far is known. The novel aspect resides in the manner in which the gain transistor Q7 and its matching transistor Q5 are supplied with current. In a prior circuit, the collectors of these transistors would be connected directly to the Vcc line. With the present invention, by contrast, they are connected into a current compensation circuit whose ultimate effect is to supply variations in the base current of gain transistor Q7 when the output load changes, thus relieving the differential voltage signal at input terminals T1, T2 from supplying this incremental base current. The ultimate result is that relatively large swings in the output current can be accommodated with little change in the input voltage differential. By definition, this translates to a significant increase in the circuit's overall transconductance, with a corresponding increase in its degree of amplification.

The new circuitry consists of a pair of npn bipolar compensation transistors Q13 and Q14 that are connected in two compensation loops; base current changes generated in Q13 compensate for base current changes in gain transistor Q7, and base current changes in Q14 compensate for base current changes in Q5. Compensation transistor Q13 has its base connected to the emitter of Q10, its collector connected to Vcc and its emitter connected to the collector of Q7, while Q14 has its base connected to the emitter of Q11, its collector connected to Vcc and its emitter connected to collector of Q5.

The manner in which Q13 and Q14 function to enhance the overall amplifier gain is explained below. First, however, the remainder of the amplifier circuitry will be described. This circuitry is known and need not be dwelled upon in detail.

The output stage 6 includes an npn output transistor Q15 whose collector receives current from a current source transistor Q16, the other side of which is connected to the Vcc bus, while its emitter is connected to ground. The base of Q15 is connected through a resistor R14 and resistor R9 to the emitter of gain transistor Q7. The output terminal T3 is taken from the collector of Q15.

An output bias line is connected between Vcc and ground, consisting of a pnp transistor Q17 whose emitter is connected to Vcc and whose base is connected in common with the base of Qs, an npn transistor Q18 whose collector is connected to the base of Q16 and through a resistor R15 to the collector of Q17 and whose base is connected to the collector of Q17, and an npn transistor Q19 having a collector connected to the emitter of Q18, a base connected between R9 and R14, and a grounded emitter. Capacitors C3 and C4 are connected on one side to the collector of Q4 and on their other sides to the output terminal T3 and the collector of Q19, respectively. Another resistor R16 and a diode-connected transistor Q20 are both connected between T3 and the collector of Q19, with a capacitor C5 between the base/collector of Q20 and the base of Q15.

Referring now to the bias section 8, a reference current that is proportionately mirrored by transistors Qs and Q17 is set up through a diode-connected pnp transistor Q21 that has its emitter connected to Vcc, and its base/collector connected to the bases of Qs and Q17. The current in Q21 flows through a resistor R17 to the remainder of the bias circuit, with the voltage on the far side of R17 from Q21 providing a base bias for Q9, Q10 and Q11. Npn transistors Q22, Q23 and Q24 along with a resistor R18 are connected in series from R17 to ground, with Q23 diode-connected and providing a current reference through common base connections with two other npn transistors Q25 and Q26. The collector of Q25 is connected to the collector of Q23, while its emitter is connected through a resistor R19 to ground. Q26 has its collector connected through a JFET J1 to Vcc, and its emitter connected through the collector-emitter circuit of npn transistor Q27 to ground; the collectors and bases of Q24 and Q27 are cross-coupled. Another capacitor C6 is connected from the collector of Q26 and base of Q22 to ground.

With the exception of transistors Q13 and Q14, the circuit as described thus far is known and corresponds to that disclosed in U.S. Pat. No. 4,687,984. The invention involves the addition of the compensation transistors Q13 and Q14 mentioned above that, together with the existing circuitry, significantly improve the amplifier's gain. In the prior circuit, the collectors of the first and second gain transistors Q7 and Q5 were connected directly to the Vcc bus. With this prior connection, any change in the output current at terminal T3 was reflected in a corresponding change in the collector-emitter current of output transistor Q15. The base current of Q15 also changed, by an amount equal to the difference in the Q15 collector current divided by the transistor's current gain $\beta$. The change in the Q15 base current was supplied by a change in the collector-emitter current of the first gain transistor Q7, which in turn produced a change in the Q7 base current. Proceeding through the circuit, the change in the Q7 base current changed the collector-emitter current of the second active load transistor Q4. This change in the Q4 current was supplied by the differential input stage, producing a change in the base voltage differential between input transistors Q1 and Q2. Thus, a change in the output signal was met by a corresponding change in the input differential signal. However, to the degree that the input signal changed, the circuit's transconductance and amplification factor were reduced.

The addition of the two compensation transistors Q13 and Q14, which are shown enclosed within a dashed line, has been found to significantly increase the amplifier's gain. The collector-emitter circuits of these two transistors are inserted between the collectors of Q7 and Q5, respectively, and the Vcc bus. To understand the operation of these transistors, assume again that the output current at terminal T3 has changed so a to produce an increase in the collector-emitter current of the first gain transistor Q7 (and thus also an increase in the Q7 base current). The increase in the Q7 collector-emitter current is supplied by an increase in the Q13 collector-emitter current, which also increases the Q13 base current. To the first order, the change in the Q13 base current is equal to the change in the base current of gain transistor Q7. Since the current through the first active load resistor R11 remains nearly constant, the increase in the Q13 base current causes a nearly equal reduction in the emitter-collector current of the first active load current source Q10. (The current through R11 remains nearly constant because any change in that current produces a change in the emitter voltage of Q10; since the base voltage of Q10 is held constant, the resulting change in the base-emitter voltage of this pnp device would oppose any change in the R11 current.)

The reduction in the current through Q10 causes a corresponding reduction in the collector-emitter current through the series connected first active load transistor Q3, and also the first input resistors R3A/R3B. However, because the bases of the active load transistors Q3 and Q4 are tied together and the transistors themselves are matched, the emitter voltage of Q4 follows that of Q3. Accordingly, the voltage across the second input resistors R4A/R4B shifts to match the voltage change across R3A/R3B. There is thus a reduction in the collector-emitter current through Q4 that is equal (to the first order) to the reduction in current through Q3, which in turn is equal (to the first order) to the increase in the base current of the first gain transistor Q7. The reduction in the collector-emitter current of Q4 causes an equal amount of current from the second active load current source Q11 to shift into the base of Q7. Thus, the increase in the Q7 base current is supplied to the first order by the compensation loop established through the first compensation transistor Q13. This takes place without requiring any change in the differential input signal at terminals T1 and T2. Any change in the differential input signal is due to second order effects, and is significantly smaller than in the prior circuit. The results of thus reducing the sensitivity of the differential input signal to changes in the output is a substantial increase in transconductance and overall circuit gain.

With a perfect circuit operation, the current through the matching second gain transistor Q5 will not vary, with the output current. In practice, however, the Q5 current can be somewhat sensitive to the output because of factors such as processing or temperature variations. Accordingly, a compensation loop is provided for Q5 through the second current compensation transistor Q14 that operates in a manner similar to the compensation loop for the first gain transistor Q7. Because of this balance in the compensation for the two gain transistors Q7 and Q5, reductions in both the absolute magnitude and the temperature dependence of Vos are achieved.

In computer simulations of the FIG. 1 circuit with and without the current compensation transistors Q13 and Q14, gains of 13,800 and 572,000 resulted when the output voltage underwent excursions from 0 to −10V and +10V, respectively, with a 2 kohm load and the collectors of Q7 and Q5 connected directly to Vcc. When the compensation transistors Q13 and Q14 were added, the gain increase to 350,000 for a 0−−10V output voltage excursion, and to 14,000,000 for a 0−+10V output voltage excursion. In an initial implementation of the circuit on a silicon wafer, a gain of approximately 200,000 was achieved with an output voltage excursion of 0−−10V, and the gain was in excess of 1,000,000 with a 0−+10V output excursion.

The improved operational amplifier circuit thus produces a larger change in output current for a given change in the input voltage differential, or in other words a higher amplifier gain. While a particular embodiment of the invention has been shown and described, numerous variations and alternate embodiments will occur to those skilled in the art. For example, while the circuit is preferably implemented with bipolar transistors, other devices with corresponding current and control circuits that could be used might be developed. Accordingly, it is intended that the invention be limited only in terms of the appended claims.

I claim:

1. In a folded cascode operational amplifier having an output stage for supplying a variable current load, a gain stage with a first bipolar gain transistor whose collector-emitter current varies as a function of the output current, and a differential input stage whose differential input voltage varies as a function of the collector-emitter current through the first gain transistor, the improvement comprising:

a first current compensation circuit connected between the collector-emitter circuit and the base of said first gain transistor to supply changes in the first gain transistor's base current associated with changes in the output current, and thereby increase the amplifier's transconductance, said first current compensation circuit including a first bipolar compensation transistor having its collector-emitter circuit connected in series with the collector-emitter circuit of said first gain transistor such that the first compensation transistor's base current approximately tracks the first gain transistor's base current, with the remainder of the first current compensation circuit actuated by changes in the first compensation transistor's base current to supply a compensating current to the base of said first gain transistor, a second bipolar gain transistor that is nominally matched with the first gain transistor and connected to balance the first gain transistor in the gain stage, and a second current compensation circuit connected between the collector-emitter circuit and the base of said second gain transistor to supply changes in the second gain transistor's base current associated with changes in its collector-emitter current, said second current compensation circuit including a second bipolar compensation transistor having its collector-emitter circuit connected in series with the collector-emitter circuit of said second gain transistor such that the second compensation transistor's base current approximately tracks the second gain transistor's base current, with the remainder of the second current compensation circuit actuated by changes in the second compensation transistor's base current to supply a compensating current to the base of said second gain transistor.

2. In a folded cascode operational amplifier having:

a) a differential input stage comprising first and second differentially connected input transistors with respective current circuits, a first input current source supplying current differentially from a first reference voltage line to the current circuits of said first and second input transistors, and first and second input resistors connected in series between the current circuits of said first and second input transistors, respectively, and a second reference voltage line, b) a gain stage comprising first and second bipolar active load transistors having their collector-emitter circuits connected on one side through respective first and second active load current sources to said first reference voltage line and on the other side to said first and second input resistors, respectively, a bias circuit for said active load transistors comprising (i) a bias current source connected on one side to said second reference voltage line and (ii) a bias transistor with its base connected between the collector-emitter circuit of said first active load current source and said first active load transistor, and its collector-emitter circuit connected in common with the other side of said bias current source to the bases of said first and second active load transistors, a first bipolar gain transistor having its base connected between said second active load current source and the collector-emitter circuit of said second active load transistor, and a final gain current source connected between one side of the collector-emitter circuit of said gain transistor and said second reference voltage line, and c) an output stage comprising an output current source, an output bipolar transistor having its base connected between said gain current source and the collector-emitter circuit of said gain transistor, and its collector-emitter circuit connected in series with said output current source between said first and second reference voltage lines, and an output terminal connected between said output current source and the collector-emitter circuit of said output transistor to supply an output current, with changes in the output current producing corresponding changes in the gain transistors collector-emitter current, wherein the improvement comprises:

a first current compensation bipolar transistor having its collector-emitter circuit connected to supply current from said first reference voltage line to the collector-emitter circuit of said gain transistor, and its base connected between said first active load current source and said first reference voltage line, a change in the output current from said output terminal being reflected by said output transistor to change the collector-emitter current of said gain transistor and thus its base current, said first current compensation transistor together with said first active load current source, first active load transistor, first and second input resistors and second active load transistor comprising a current compensation loop that responds to a change in the gain transistor's collector-emitter current by supplying an associated change in the gain transistor's base current, thereby increasing the amplifier's transconductance.

3. The operational amplifier of claim 2, said first active load current source comprising a bipolar transistor having its collector connected to the collector-emitter circuit of said first active load transistor, its emitter connected to said first reference voltage line through an active load resistor and its base connected to a fixed bias voltage source, with the base of said first current compensation transistor connected between the emitter of said first active load current source transistor and said active load resistor, changes in the current through said active load resistor being resisted by a compensating change in the base-emitter voltage of said first active load current source transistor, so that changes in the base current of said first compensation transistor are transmitted through said first active load current source transistor to said first input resistor.

4. The operational amplifier of claim 3, wherein said first and second active load transistors are matched so that a change in the voltage across said first input resistor is matched by a corresponding change in the voltage across said second active load transistor, thereby producing a corresponding change in the collector-emitter current of said second active load transistor that is supplied to the base of said first gain transistor.

5. The operational amplifier of claim 2, said improvement further comprising:

a second current compensation bipolar transistor having its collector-emitter circuit connected to supply current from said first reference voltage line to the collector-emitter circuit of said bias transistor, and its base connected between said second active load current source and said first reference voltage line, said second current compensation transistor together with said second active load current source, second active load transistor, second and first input resistors and first active load transistor comprising a current compensation loop that responds to changes in said bias transistor's collector-emitter current by supplying corresponding changes in its base current.

6. In a folded cascode operational amplifier having an output stage for supplying a variable output current load, a gain stage having a first gain transistor, said gain transistor including a control circuit and a current circuit whose current varies as a function of the output current, and a differential input stage whose differential input voltage varies as a function of the current through the first gain transistor's control circuit, the improvement comprising:

a first current compensation circuit connected between the current circuit and the control circuit of said first gain transistor to supply changes in the first gain transistor's control current associated with changes in the current through its current circuit, and thereby increase the amplifier's transconductance, said first current compensation circuit comprising a first compensation transistor having a current circuit connected in series with the current circuit of said first gain transistor such that the first compensation transistor's control current approximately tracks the first gain transistor's control current, with the remainder of the first current compensation circuit actuated by changes in the first compensation transistor's control current to supply a compensating current to the control circuit of said first gain transistor, a second gain transistor that has a current circuit and a control circuit and is nominally matched with the first gain transistor and connected to balance the first gain transistor in the gain stage, and a second current compensation circuit connected between the current and control circuits of said second gain transistor to supply changes in the second gain transistor's control current associated with changes in the current through its current circuit, said second current compensation circuit including a second compensation transistor having a current circuit connected in series with the current circuit of said second gain transistor such that the second compensation transistor's control current approximately tracks the second gain transistor's control current, with the remainder of the second current compensation circuit actuated by changes in the second compensation transistor's control current to supply a compensating current to the control circuit of said second gain transistor.

* * * * *